United States Patent [19]
Klemmer

[11] Patent Number: 6,163,235
[45] Date of Patent: Dec. 19, 2000

[54] ACTIVE LOAD CIRCUIT WITH LOW IMPEDANCE OUTPUT

[75] Inventor: Nikolaus Klemmer, Apex, N.C.

[73] Assignee: Ericsson Inc., Research Triangle Park, N.C.

[21] Appl. No.: 09/144,945

[22] Filed: Sep. 1, 1998

[51] Int. Cl.$^7$ .................................................. H01P 1/22
[52] U.S. Cl. ........................................ 333/81 R; 330/110
[58] Field of Search .................................. 330/260, 291, 330/293, 98, 311, 252, 308, 110, 99, 310; 327/359; 250/214 A; 333/81 R

[56] References Cited

U.S. PATENT DOCUMENTS

| | | | |
|---|---|---|---|
| 3,444,473 | 5/1969 | Sherman | 330/30 |
| 3,460,047 | 8/1969 | Gilbert | 330/18 |
| 3,651,339 | 3/1972 | Herrmann et al. | 307/237 |
| 3,652,949 | 3/1972 | Szabo | 330/30 D |
| 3,986,133 | 10/1976 | Roza et al. | 330/18 |
| 4,683,443 | 7/1987 | Young et al. | 330/277 |
| 4,937,534 | 6/1990 | Bohme | 330/252 |
| 5,349,304 | 9/1994 | Ryat | 330/253 |
| 5,525,929 | 6/1996 | Nagahori et al. | 330/110 |
| 5,691,670 | 11/1997 | Lohninger | 331/96 |
| 5,708,392 | 1/1998 | Gross | 330/308 |

*Primary Examiner*—Robert Pascal
*Assistant Examiner*—Henry Choe
*Attorney, Agent, or Firm*—Woods, Phillips, VanSanten, Clark & Mortimer

[57] ABSTRACT

A transimpedance stage amplifier converts a current input signal at an input node to a low impedance output voltage at an output node. The amplifier includes a resistor connected between the input node and the output node. A feedback loop is connected across the resistor, the feedback loop comprising a transistor, the transistor using the current input signal as a biasing current.

21 Claims, 4 Drawing Sheets

ACTIVE LOAD CIRCUIT WITH LOW IMPEDANCE OUTPUT

FIELD OF THE INVENTION

This invention relates to active load circuits and, more particularly, to an active load circuit with low impedance output.

BACKGROUND OF THE INVENTION

Active load circuits with current-to-voltage transfer stages, also known as transimpedance stages, convert an output current typically generated by a voltage-to-current transfer stage, also known as transconductance, back into a voltage. These circuits are used, for example, in the area of analog electrical circuit topologies for application specific integrated circuits (ASICs) manufactured in process technologies that provide bipolar transistors, or enhancement mode MOS transistors, or both in the case of BiCMOS technologies.

Where a voltage amplifier is necessary in an analog signal processing chain internal to the ASIC or at the interface between the ASIC and its environment, it is desirable to provide a low impedance at the amplifier's output node. This has the benefit of an output voltage that is independent of the characteristics of the load impedance. For integrated circuits that operate at low supply voltages, it is important to have circuit topologies that provide sufficient output voltage swing without requiring a lot of "headroom". The additional supply voltage necessary to operate the circuit should be small compared to the voltage swing available at the output.

If the integrated circuit is used for battery operated portable devices, such as cellular telephones, mobile communication devices, etc., the requirements of high voltage efficiency and low output impedance should be met with the minimum amount of supply current possible. In general, circuit topologies that perform impedance transformation to lower impedances require a significant amount of supply current.

The present invention is directed to overcoming one or more of the problems discussed above, in a novel and simple manner.

SUMMARY OF THE INVENTION

In accordance with the invention, a circuit achieves a zero added supply current for the impedance transformation function at an amplifier's output without significantly changing the amplifier's other performance characteristics.

Broadly, there is disclosed herein a transimpedance stage amplifier for converting a current input signal at an input node to a low impedance output voltage at an output node. The amplifier includes a resistor connected between the input node and the output node. A feedback loop is connected across the resistor, the feedback loop comprising a transistor, the transistor using the current input signal as a biasing current.

It is a feature of the invention that the transistor comprises a bipolar transistor having a base element connected to the input node. A collector element is connected to the output node.

It is another feature of the invention that the transistor comprises a FET having a gate element connected to the input node. A drain element is connected to the output node.

There is disclosed in accordance with another aspect of the invention a transimpedance stage amplifier including a resistor connected between the input node and the output node. A transistor has a control element, an output element and a supply element. The control element is connected to the input node. The output element is connected to the output node to provide a feedback loop connected across the resistor.

There is disclosed in accordance with a further aspect of the invention an amplifier circuit for an active load developing a low impedance output voltage at an output node. The amplifier circuit includes a transconductance stage connected to a voltage source for developing a current signal. A transimpedance stage includes a resistor connected between the transconductance stage and the output node and a transistor having a control element, an output element and a supply element. The control element is connected to the transconductance stage and the output element is connected to the output node to provide a feedback loop connected across the resistor.

In accordance with a further aspect of the invention there is disclosed a differential amplifier circuit having first and second voltage input nodes and first and second voltage output nodes. The circuit includes an input stage connected to the first and second voltage input nodes developing first and second current outputs and first and second transimpedance stages. The first transimpedance stage has a first resistor connected between the first current output and the first output node and a first transistor having a control element, an output element and a supply element. The control element is connected to the first current output when the output element is connected to the first output node to provide a feedback loop connected across the resistor. The second transimpedance stage has a second resistor connected between the second current output and the second output node and a second transistor having a control element, an output element, and a supply element. The control element is connected to the second current output and the output element is connected to the second output node to provide a feedback loop connected across the second resistor.

In accordance with a further aspect of the invention there is disclosed a switching mixer circuit having first and second voltage input nodes and first and second voltage output nodes. The circuit includes an input stage connected to the first and second voltage input nodes developing first and second current outputs and first and second transimpedance stages. The first transinipedance stage has a first resistor connected between the first current output and the first output node and a first transistor having a control element, an output element and a supply element. The control element is connected to the first current output when the output element is connected to the first output node to provide a feedback loop connected across the resistor. The second transimpedance stage has a second resistor connected between the second current output and the second output node and a second transistor having a control element, an output element, and a supply element. The control element is connected to the second current output and the output element is connected to the second output node to provide a feedback loop connected across the second resistor.

The nature of the invention lies in the use of a feedback loop to lower the output impedance of a transimpedance stage. The circuit providing the feedback loop reuses the current that is used in the transconductance stage of the amplifier. As a result, no additional supply current is necessary.

Further features and advantages of the invention will be readily apparent from the specification and from the drawing.

DETAILED DESCRIPTION OF THE PREFERRED EMBODIMENT

Figure 1:
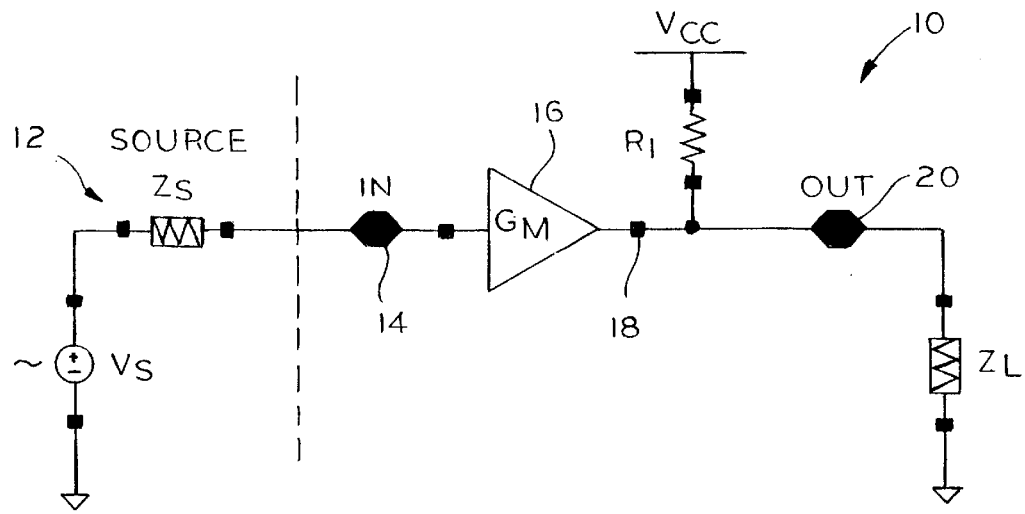
FIG. 1 is an electrical schematic of a prior art amplifier using a pull-up resistor as a transimpedance element.

Referring initially to FIG. 1, a prior art amplifier circuit 10 is illustrated. The amplifier circuit 10 receives a voltage signal from a source 12 including a supply $V_S$ connected through an impedance $Z_S$ to an input node 14. A transconductance stage 16, represented by a transfer function $G_M$, converts the voltage at the input node 14 into a current at a node 18. This current is either proportional to the input voltage, as in the case of a linear amplifier, or a current that is a non-linear representation of the input voltage in the case of a limiting amplifier. The node 18 is connected to an output node 20. The output node 20 is in turn connected to an active load, represented by the impedance $Z_L$. In the circuit of FIG. 1, a pull-up resistor $R_1$ is used to convert a signal current from the transconductance stage 16 into a signal voltage at the output node 20.

A figure of merit, designated $\eta_v$, is the ratio of available peak-to-peak voltage swing and the minimum supply voltage necessary to achieve this voltage swing. This value is used for comparing the circuit of FIG. 1 with other circuits herein.

In the circuit of FIG. 1, assuming that the transconductance stage 16 comprises a basic bipolar, single transistor, un-degenerated, common emitter, the supply voltage efficiency of the circuit is $\eta_v = [1+V_{CE,SAT}/V_{PP}]^{-1}$. With the collector-emitter saturation voltage $V_{CE,SAT}=0.2V$ and the peak-to-peak output voltage $V_{PP}=0.5V$, this yields $\eta_v=0.71$. The current consumption is given by the current consumption of the transconductance stage 16 only, and is equal to $I_{GM}$.

Figure 2:
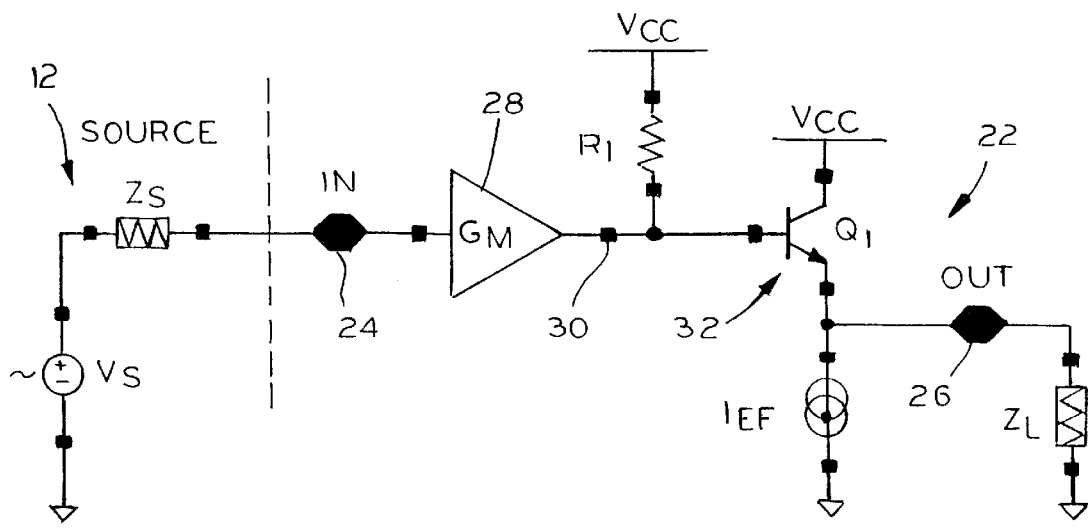
FIG. 2 is an electrical schematic of a prior art amplifier, similar to that of FIG. 1, using a unity-gain emitter follower as an impedance transformation stage.

Referring to FIG. 2, an electrical schematic of a prior art amplifier circuit 22 is illustrated. The amplifier circuit 22 includes an input node 24 connected to the source 12 and an output node 26 connected to the active load $Z_L$. A transconductance stage 28 is connected to the input node 24 and develops a current at a node 30, as above. A pull-up resistor $R_1$ is connected between $V_{CC}$ and the node 30. The circuit of FIG. 2 differs from the circuit of FIG. 1 in adding a unity-gain amplifier circuit 32 between the current node 30 and the output node 26. The unity-gain amplifier circuit 32 reduces the amount of gain reduction coming from the fact that the load impedance is connected to the output. The effective load impedance as seen looking into the input of the unity-gain stage 32 is now multiplied by the current gain $\beta$ of the transistor Q1. Also, the output impedance is greatly reduced with respect to the output impedance of the circuit in FIG. 1. This makes the voltage at the output node 26 more independent of the specific value of the load impedance.

With the circuit of FIG. 2, and assuming a transconductance stage 28 similar to that discussed above relative to FIG. 1, with $V_{BE}=0.8V$, $V_{CE,SAT}=0.2V$, and $V_{PP}=0.5V$, then the figure of merit $\eta_v=0.333$. The current consumption of the circuit is given by the current consumption $I_{GM}$ Plus the current consumption of the unity-gain stage $I_{EF}$.

With the circuit of FIG. 1, the output impedance is mainly determined by the value of the resistor $R_1$. The voltage gain in the presence of a finite load impedance is determined by the parallel connection of the resistor $R_1$ and the load impedance $Z_L$. The circuit in FIG. 1 is practically limited to applications internal to an integrated circuit. Due to lack of low output impedance, the circuit is typically not used to drive signals off of a chip.

A disadvantage with the circuit of FIG. 2 is that the supply current consumption is increased with respect to the basic circuit. Since both of these currents typically are of the same order of magnitude, the increase in supply current is significant. Another disadvantage is that the supply voltage efficiency is reduced. This relates to the fact that there is a voltage drop across the base-emitter junction of the emitter follower device $V_{BE}$.

In accordance with the invention the goals of reduced current consumption and increased supply voltage efficiency are achieved by using a resistor as the transimpedance element inside a feedback loop. The feedback loop is established through an additional transistor. This transistor re-uses the biasing current of the transconductance stage and hence needs not additional biasing current.

Referring to FIGS. 3A–3D, implementations of a transimpedance stage according to the invention are illustrated. In each implementation, a current input signal is represented at an input node $I_{IN}$ and an output node is represented at $V_{OUT}$.

Figure 3A:
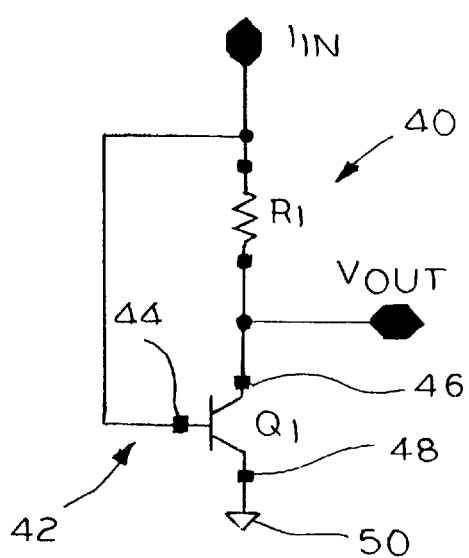
FIG. 3A–3D illustrate circuits for a transimpedance stage amplifier according to the invention.

Referring initially to FIG. 3A, a transimpedance stage 40 for an amplifier comprises a resistor $R_1$ connected between the input node $I_{IN}$ and the output node $V_{OUT}$. A feedback loop 42 is connected across the resistor $R_1$. The feedback loop 42 comprises a transistor $Q_1$. The transistor $Q_1$ has a control element 44, an output element 46, and a supply element 48. In the circuit of FIG. 3A, the transistor $Q_1$ is a bipolar npn transistor and the control element 44 is a base element, the output element 46 is a collector element, and the supply element 48 is an emitter element. The base element 44 is connected to the input node $I_{IN}$. The output element 46 is connected to the output node $V_{OUT}$. The supply element 48 is connected to a ground node 50.

Figure 3B:
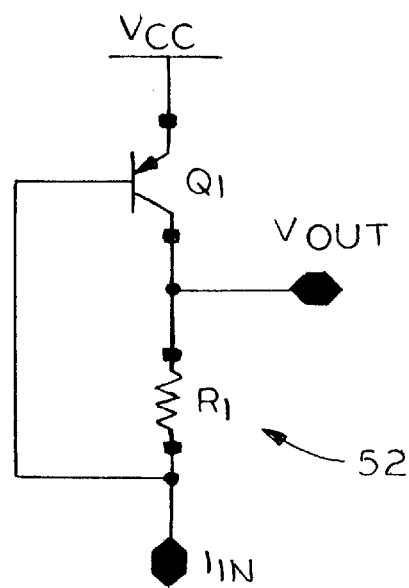

FIG. 3B illustrates another implementation of a transimpedance stage 52 according to the invention. The circuit 52 is similar to the circuit 40, except that the transistor $Q_1$ comprises a bipolar pnp transistor and the emitter element is connected to a voltage node $V_{CC}$.

Figure 3C:
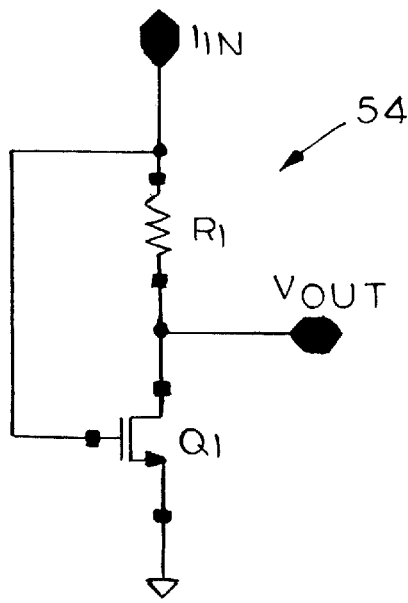

FIG. 3C illustrates another implementation of a transimpedance stage 54 according to the invention. The circuit 54 differs from the circuit 40 of FIG. 3A in that the transistor $Q_1$ comprises an n-type FET. In this instance, the control element consists of a gate element, the output element consists of a drain element, and the supply element consists of a source element, as is well known.

Figure 3D:
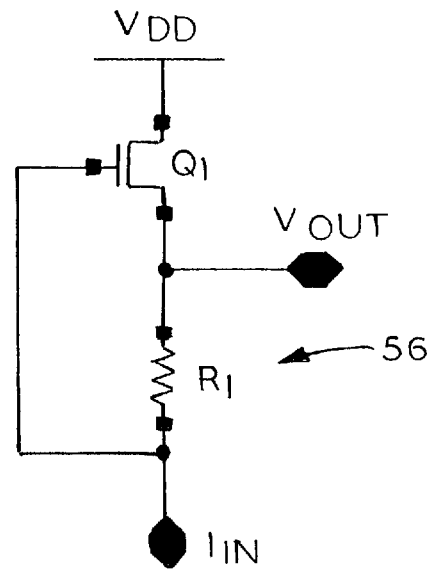

Referring to FIG. 3D, still another implementation of a transimpedance stage 56 according to the invention is illustrated. The circuit of FIG. 6 differs from that of FIG. 3C in that the transistor $Q_1$ comprises a p-type FET with the drain connected to a voltage node $V_{DD}$.

Figure 4:
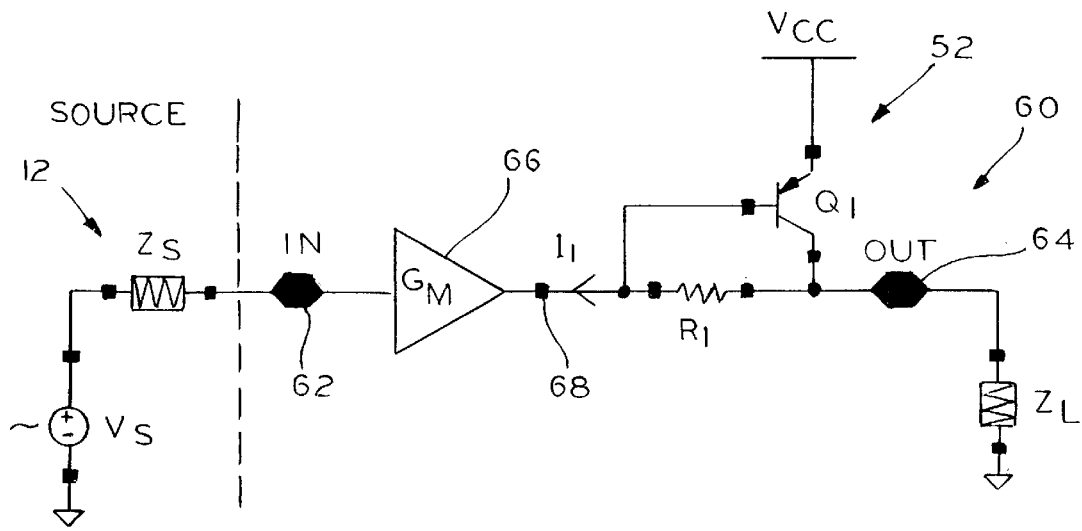
FIG. 4 is an electrical schematic of an amplifier circuit using the transimpedance stage according to the invention.

Referring to FIG. 4, an amplifier circuit 60 including a transimpedance stage according to the invention is illustrated. The amplifier circuit 60 receives voltage from the source 12 at an input node 62 and delivers a voltage at an output node 64 to an active load represented by the impedance $Z_L$. The input node 62 is connected to a transconductance stage 66 that converts the input voltage at the input node 62 into a current at its output, at a node 68. The current is labeled $I_1$. The circuit 60 uses the implementation of the transimpedance stage amplifier 52 shown in FIG. 3B. Looking from the output of the transconductance stage at the node 68 into the active load with low impedance output circuit, it is clear that the circuit behaves like a regular diode-connected transistor. The input impedance is equal to $V_T/I_1$, assuming the simplified Ebers-Moll model for a bipolar transistor. Since the output current of the transconductance stage 66 has to flow in the collector of the transistor $Q_1$, less the base current in $Q_1$, the voltage at the output of the transconductance stage 66 is lower than $V_{CC}$ by the voltage drop across the base emitter junction of the transistor $Q_1$.

Compared to the transimpedance $R_1$ of the circuit shown in FIGS. 1 and 2, the transimpedance in the circuit of FIG. 4 is reduced by the amount $V_T/I_1$. This results in a small amount of gain reduction in a typical amplifier that can easily be offset by increasing the resistor value of $R_1$ by this amount. Where an un-degenerated common emitter cell is used for the transconductance stage 66, and a voltage gain of numeric 10 is desired, the resistor $R_1$ will have to change by ten percent to offset the described gain reduction.

The output impedance of the transimpedance stage 52 is unchanged with respect to the emitter follower circuit of FIG. 2 if the biasing current $I_1$ and the biasing current $I_{EF}$ of the emitter follower device of FIG. 2 are equal. In all other cases, they differ by the ratio of biasing currents. The output impedance here is:

$$R_{OUT} = V_T/I_1 + R_1/\beta_1.$$

Since the current gain of bipolar devices is typically between 50 ... 100, the influence of the $R_1/\beta_1$ contribution is usually small. Assume again an amplifier gain of ten, as from the previous paragraph. The resistor $R_1$ has to be $R_1=(10+1) *V_T/I_1$. Using $\beta=100$, $R_1/\beta_1$, changes the output impedance by eleven percent with respect to ideal value $V_T/I_1$. This impedance is in fact low, as can be seen assuming a 1 mA biasing current in the transconductance stage 66. At room temperature, the output impedance with the disclosed circuit is 29 Ω whereas in the original circuit of FIG. 1, the output impedance is equal to the value of $R_1=286$ Ω. Also, the current consumption does not increase over the circuit of FIG. 1.

For temperature independent circuit parameters, the biasing current of the transconductance cell 66 and the biasing current of the transimpedance stage 52 should be proportional to absolute temperature (PTAT). This makes the term $V_T/I_1$ temperature independent.

Figure 5:
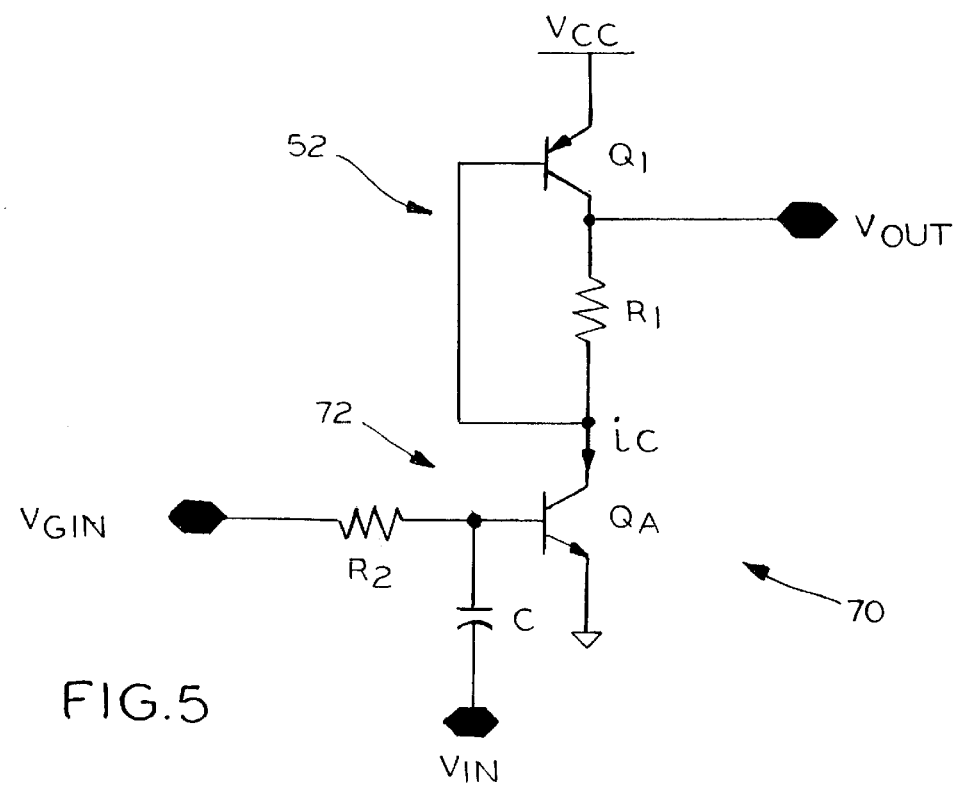
FIG. 5 is an electrical schematic of an undegenerated CE amplifier using the transimpedance stage according to the invention.

Assuming that the transconductance stage 66 is similar to that discussed above relative to FIG. 1, the supply voltage efficiency of the circuit of FIG. 5, using $V_{BE}=0.8V$, $V_{CE,SAT}=0.2V$, and $V_{PP}=0.5V$, is $\eta_v=0.5$. This is a fifty percent increase over the circuit of FIG. 2. This circuit operates down to supply voltages as low as $V_{BE}+V'_{CE,SAT}$. With typical bipolar process parameters, this elevates to 1V minimum supply voltage.

The linearity of the transimpedance cell is limited due to the finite loop gain established by the device $Q_1$. As a figure of merit, the distortion contributed from third order coefficients in the transimpedance transfer function can be characterized via the two-tone third order input referred intercept point. This intercept point describes the input current amplitude of each of two signals of different frequency that produces a third order distortion with an amplitude equal to the input amplitudes. For the circuit of FIG. 4, it can be shown:

$$I_{IIP3,TWO} = 2*\sqrt{|I_1 R_1/V_T - 1|}$$

This number can be used to determine the overall cascaded input referred intercept point of an amplifier that uses this transimpedance stage rather than the ideal, linear resistor approach of FIG. 1.

For an amplifier using a common emitter stage as a transconductance stage 66, as discussed above, the input referred two-tone third order intercept point is reduced by approximately a factor of $[1-I_1*R_1/(2*V_T)]$. For a voltage gain of numeric 10, this amounts to about five percent (or 0.5 dB) reduction only.

Thus, using an active load with low impedance output transimpedance stage over a simple resistor drastically reduces the output impedance of the amplifier without adding any supply current. The output impedance is the same that is achievable using an additional emitter follower buffer, such as in FIG. 2. The circuit of FIG. 4 also reduces the supply voltage required over the emitter follower solution of FIG. 2 and operates down to 1V supply voltage in bipolar implementations.

Referring to FIG. 5, the transimpedance stage 52 is illustrated in an application for a bipolar CE amplifier circuit 70. The circuit 70 is a basic amplifier circuit such as used for a microphone. The transconductance stage 72 consists of a transistor QA. A bias voltage $V_{BIAS}$ is connected via a resistor R2 to the base of the transistor QA. A capacitor C is connected between the base of the transistor QA and a voltage in node $V_{IN}$. The transimpedance stage 52 is connected to the collector of the transistor QA.

Figure 6:
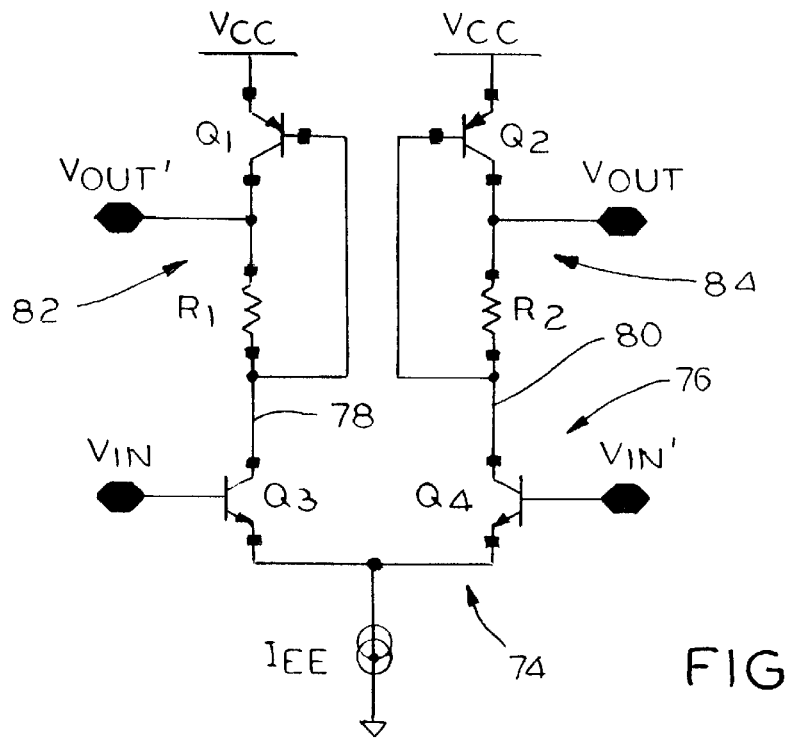
FIG. 6 is an electrical schematic of a differential amplifier using dual transimpedance stages according to the invention.

Referring to FIG. 6, a circuit illustrates use of the transimpedance stage according to the invention for a differential amplifier circuit 74. The differential amplifier circuit 74 includes an input stage 76 connected to first and second voltage input nodes, labeled $V_{IN}$ and $V_{IN'}$ developing first and second current output at 78 and 80, respectively. A first transimpedance stage 82 converts the current signal at 78 to drive a first voltage output node $V_{OUT}$. The transimpedance stage 82 uses the circuit of FIG. 3B. A second transimpedance stage 84 converts the current at 80 to a voltage at a second voltage output node $V_{OUT}$. The transimpedance stage 84 is also similar to the circuit of FIG. 3B.

Figure 7:
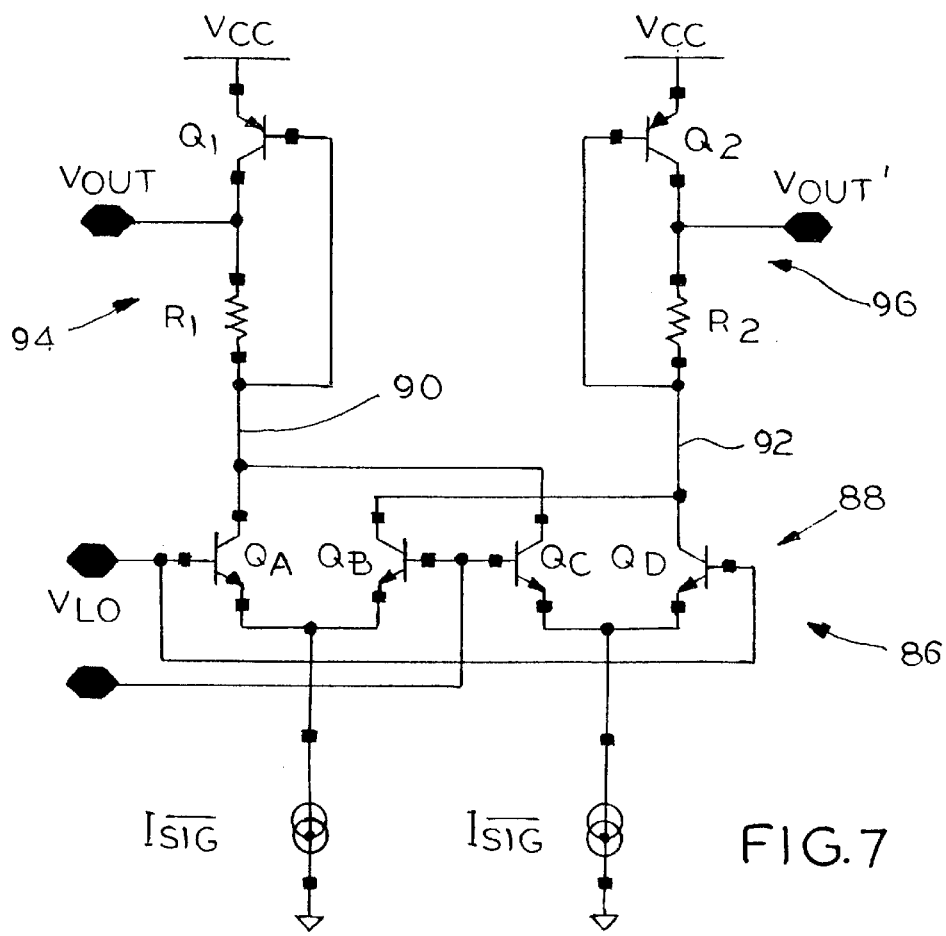
FIG. 7 is an electrical schematic of a switching mixer using dual transimpedance stages according to the invention.

Referring to FIG. 7, a circuit illustrates use of the transimpedance stage according to the invention for a switching mixer 86. The switching mixer 86 includes an input stage 88 connected across first and second voltage input nodes, labeled $V_{LO}$, developing first and second current output at 90 and 92, respectively. A first transimpedance stage converts the current signal at 90 to drive a first voltage output node $V_{OUT}$. The transimpedance stage 94 uses the circuit of FIG. 3B. A second transimpedance stage 96 converts the current at 92 to a voltage at a second voltage output node $V_{OUT}$. The transimpedance stage 96 is also similar to the circuit of FIG. 3B.

Thus, in accordance with the invention there is provided an active load circuit with a low impedance output using a reduction of supply current and an increase of supply voltage efficiency.

I claim:

1. A transimpedance stage amplifier for converting a current input signal at an input node to a low impedance output voltage at an output node comprising:

a resistor connected between the input node and the output node; and a feedback loop connected across the resistor, the feedback loop comprising a transistor, the transistor using the current input signal as a biasing current.

2. The transimpedance stage amplifier of claim 1 wherein the transistor comprises a bipolar transistor having a base element connected to the input node.

3. The transimpedance stage amplifier of claim 2 wherein the bipolar transistor also comprises an emitter element and a collector element and the collector element is connected to the output node.

4. The transimpedance stage amplifier of claim 1 wherein the transistor comprises a FET having a gate element connected to the input node.

5. The transimpedance stage amplifier of claim 4 wherein the FET also comprises a source element and a drain element and the drain element is connected to the output node.

6. A transimpedance stage amplifier for converting a current input signal at an input node to a low impedance output voltage at an output node comprising:

a resistor connected between the input node and the output node; and a transistor having a control element, an output element and a supply element, the control element being connected to the input node and the output element being connected to the output node to provide a feedback loop connected across the resistor.

7. The transimpedance stage amplifier of claim 6 wherein the transistor comprises a bipolar transistor and the control element comprises a base element connected to the input node.

8. The transimpedance stage amplifier of claim 7 wherein the supply element comprises an emitter element and the output element comprises a collector element connected to the output node.

9. The transimpedance stage amplifier of claim 6 wherein the transistor comprises a FET and the control element comprises a gate element connected to the input node.

10. The transimpedance stage amplifier of claim 9 wherein the supply element comprises a source element and the output element comprises a drain element connected to the output node.

11. An amplifier circuit for an active load developing a low impedance output voltage at an output node comprising:

a transconductance stage connected to a voltage source for developing a current signal; and a transimpedance stage including a resistor connected between the transconductance stage and the output node, and a transistor having a control element, an output element and a supply element, the control element being connected to the transconductance stage and the output element being connected to the output node to provide a feedback loop connected across the resistor.

12. The amplifier circuit of claim 11 wherein the transistor comprises a bipolar transistor and the control element comprises a base element connected to the input node.

13. The amplifier circuit of claim 12 wherein the supply element comprises an emitter element and the output element comprises a collector element connected to the output node.

14. The amplifier circuit of claim 11 wherein the transistor comprises a FET and the control element comprises a gate element connected to the input node.

15. The amplifier circuit of claim 14 wherein the supply element comprises a source element and the output element comprises a drain element connected to the output node.

16. A differential amplifier circuit having first and second voltage input nodes and first and second voltage output nodes, the circuit comprising:

an input stage connected to the first and second voltage input nodes developing first and second current outputs; and first and second transimpedance stages, the first transimpedance stage having a first resistor connected between the first current output and the first output node, and a first transistor having a control element, an output element and a supply element, the control element being connected to the first current output and the output element being connected to the first output node to provide a feedback loop connected across the first resistor, the second transimpedance stage having a second resistor connected between the second current output and the second output node, and a second transistor having a control element, an output element and a supply element, the control element being connected to the second current output and the output element being connected to the second output node to provide a feedback loop connected across the second resistor.

17. The differential amplifier circuit of claim 16 wherein the first and second transistors comprises bipolar transistors.

18. The differential amplifier circuit of claim 16 wherein the first and second transistors comprises a FETs.

19. A switching mixer circuit having first and second voltage input nodes and first and second voltage output nodes, the circuit comprising:

an input stage, the input stage including a pair of differential amplifiers each driven by a separate signal source, connected to the first and second voltage input nodes developing first and second current outputs; and first and second transimpedance stages, the first transimpedance stage having a first resistor connected between the first current output and the first output node, and a first transistor having a control element, an output element and a supply element, the control element being connected to the first current output and the output element being connected to the first output node to provide a feedback loop connected across the first resistor, the second transimpedance stage having a second resistor connected between the second current output and the second output node, and a second transistor having a control element, an output element and a supply element, the control element being connected to the second current output and the output element being connected to the second output node to provide a feedback loop connected across the second resistor.

20. The switching mixer circuit of claim 19 wherein the first and second transistors comprises bipolar transistors.

21. The switching mixer circuit of claim 19 wherein the first and second transistors comprises a FETs.

* * * * *